United States Patent
Nall et al.

(10) Patent No.: US 8,756,801 B2
(45) Date of Patent: Jun. 24, 2014

(54) METHOD OF MANUFACTURING A LIGHTING ASSEMBLY WITH THERMAL OVERMOLDING

(75) Inventors: Jeffrey Nall, Brecksville, OH (US); Matthew Mrakovich, Streetsboro, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 301 days.

(21) Appl. No.: 13/303,591

(22) Filed: Nov. 23, 2011

(65) Prior Publication Data

US 2012/0066900 A1 Mar. 22, 2012

Related U.S. Application Data

(62) Division of application No. 11/289,672, filed on Nov. 29, 2005, now Pat. No. 8,465,175.

(51) Int. Cl.
*H05K 3/30* (2006.01)

(52) U.S. Cl.
USPC .............................. 29/841; 29/832; 362/612

(58) Field of Classification Search
CPC ............................. H05K 5/0095; H05K 3/284; H05K 2201/10106
USPC ............... 29/832, 841; 174/526, 535; 313/51, 313/110, 318.01; 362/227, 612, 631, 800
See application file for complete search history.

(56) References Cited

U.S. PATENT DOCUMENTS

| | | | |
|---|---|---|---|
| 4,855,882 A | 8/1989 | Boss | |
| 5,036,248 A * | 7/1991 | McEwan et al. | 313/110 |
| 5,313,729 A * | 5/1994 | Sakai et al. | 362/227 |
| 5,528,474 A | 6/1996 | Roney et al. | |
| 5,632,551 A | 5/1997 | Roney et al. | |
| 5,857,767 A | 1/1999 | Hochstein | |
| 5,986,317 A | 11/1999 | Wiese | |
| 6,017,241 A | 1/2000 | Komai | |
| 6,074,074 A | 6/2000 | Marcus | |
| 6,320,128 B1 * | 11/2001 | Glovatsky et al. | 174/526 |

(Continued)

FOREIGN PATENT DOCUMENTS

| EP | 0 818 652 B1 | 7/1997 |
|---|---|---|
| EP | 1 233 232 A2 | 11/2001 |

(Continued)

OTHER PUBLICATIONS

PolyOne Corporation Technical Data Sheet, Therma-tech LC-6000 TC, 1 page, at www.PolyOne.com.

(Continued)

*Primary Examiner* — Donghai D Nguyen
(74) *Attorney, Agent, or Firm* — Fay Sharpe LLP

(57) ABSTRACT

One or more light emitting diode diodes (LEDs) are attached to a printed circuit board. The attached LEDs are connectable with a power source via circuitry of the printed circuit board. An overmolding material is insert molded an over at least portions of the printed circuit board proximate to the LEDs to form a free standing high thermal conductivity material overmolding that covers at least portions of the printed circuit board proximate to the LEDs. The free standing high thermal conductivity material has a melting temperature greater than about 100° C. and has a thermal conductivity greater than or about 1 W/m·K. In some embodiments, the free standing high thermal conductivity material is a thermoplastic material.

9 Claims, 4 Drawing Sheets

(56) References Cited

U.S. PATENT DOCUMENTS

| | | |
|---|---|---|
| 6,481,874 B2 | 11/2002 | Petroski |
| 6,505,955 B1 | 1/2003 | Hatjasalo et al. |
| 6,517,218 B2 | 2/2003 | Hochstein |
| 6,566,824 B2 | 5/2003 | Panagotacos et al. |
| 6,600,633 B2 | 7/2003 | Macpherson et al. |
| 6,799,864 B2 | 10/2004 | Bohler et al. |
| 6,834,980 B2 | 12/2004 | Okano et al. |
| 6,837,598 B2 | 1/2005 | Marcus |
| 6,945,672 B2 | 9/2005 | Du et al. |
| 7,108,385 B2 * | 9/2006 | Huang et al. ............... 362/631 |
| 2002/0149948 A1 | 10/2002 | Okano et al. |
| 2003/0072153 A1 | 4/2003 | Matsui et al. |
| 2003/0179548 A1 | 9/2003 | Becker et al. |
| 2005/0209400 A1 | 9/2005 | Tsumura et al. |
| 2005/0221659 A1 | 10/2005 | Mrakovich et al. |
| 2005/0224255 A1 | 10/2005 | Becherer |
| 2005/0239227 A1 * | 10/2005 | Aanegola et al. ............. 438/116 |
| 2006/0035511 A1 | 2/2006 | Mrakovich et al. |
| 2006/0116021 A1 | 6/2006 | Dennes et al. |
| 2007/0015396 A1 | 1/2007 | Mrakovich et al. |

FOREIGN PATENT DOCUMENTS

| | | |
|---|---|---|
| WO | WO 90/02906 | 3/1990 |
| WO | WO 96/18210 | 6/1996 |
| WO | WO 02/33312 | 4/2002 |
| WO | WO 2004/023033 | 3/2004 |
| WO | WO 2005/076376 | 8/2005 |

OTHER PUBLICATIONS

PolyOne Corporation Technical Data Sheet, Therma-tech LC-5000 TC, 1 page, at www.PolyOne.com.

PolyOne Corporation Technical Data Sheet, Therma-tech SF-4500 TC, 2 pages, at www.PolyOne.com.

PolyOne Corporation Technical Service Report No. 90, Therma-Tech Thermally Conductive Compounds, 7 pages, May 2002.

Luxeon Application Brief AB23, Thermal Design Considerations for Luxeron 5 Watt Power Light Sources, 8 pages (2002).

Luxeon Technical Data DS34, Luxeon V Emitter, 9 pages (2004).

\* cited by examiner

METHOD OF MANUFACTURING A LIGHTING ASSEMBLY WITH THERMAL OVERMOLDING

This is a divisional application of prior application Ser. No. 11/289,672 filed Nov. 29, 2005. Application Ser. No. 11/289,672 filed Nov. 29, 2005, now U.S. Pat. No. 8,465,175 is incorporated herein by reference in its entirety.

BACKGROUND

The following relates to the lighting arts. It especially relates to LED-based lighting assemblies including LED-based lighting assembly modules for flexible lighting strips. However, the following will also find application in conjunction with lighting assemblies, methods for manufacturing lighting assemblies, electronics associated with lighting assemblies, and applications employing lighting assemblies, such as illumination, illuminated channel lettering, border lighting, and so forth.

Light emitting diodes (LEDs) are used in lighting assemblies, where they have certain advantages of incandescent, fluorescent, and other lighting technologies. For example, LEDs are compact, durable, relatively energy efficient, operable at low voltage, and so forth. In a typical arrangement, one or more LEDs are attached to a printed circuit board and are connectable with a power source via circuitry of the printed circuit board. If the power source is not directly compatible with the LEDs (for example, a 110 VAC house voltage applied to LEDs that typically operate at a few volts DC) then the printed circuit can also include power conditioning circuitry that converts the power to a form amenable to driving the LEDs. Alternatively or additionally, an AC/DC converter, DC power supply, or other power conditioning component can be interposed between the 110 VAC and the printed circuit board.

High brightness LEDs in lighting assemblies typically operate at relatively low voltage but relatively high current. The total electrical power input to a commercial high-brightness LEDs is typically at the level of hundreds of milliwatts to a few watts per LED. Accordingly, efficient removal of generated heat is a concern.

One known approach for removing excess heat generated during LED operation is the use of metal heat sinks. Luxeon® LED emitters (available from LumiLeds Lighting, LLC, San Jose, Calif.) and some other commercial high-brightness LEDs include a metal heat slug on which the semiconductor chip is attached or otherwise thermally contacts. In order to maintain a compact profile, the metal heat slug of the LED cannot be very large, and is typically intended to conduct heat to a larger external heat sink that provides dissipation of heat to the surrounding ambient. Accordingly, the LED is mounted on a metal heat sink. In some lighting assemblies, the metal heat sink is incorporated into the printed circuit board. Such a composite board is commonly referred to as a metal core printed circuit board.

A metal heat sink adds substantial cost and weight to the lighting assembly, and may be relatively inefficient at dissipating heat. Common heat sink metals such as copper have high density, making heat sinks massive. Moreover, the surface area for dissipation of heat to the ambient corresponds to the surface area of the metal heat sink. To achieve good thermal coupling with the ambient, metal heat sinks typically include fins or other radiating structures, which increases weight and bulk of the heat sink. Optionally, forced air convection generated by a fan can be used to increase heat transfer to the ambient, or active water cooling can be incorporated. However, these approaches add substantial cost, bulk, and complexity to the lighting assembly.

Another problem with metal heat sinks is that the thermal pathway from the LED to the metal heat sink is of limited area. If the LED is mounted by mounting leads, the thermal pathway may be limited to the area of the leads. In some lighting assemblies, a thermally conductive underfill material is disposed between the LED and the metal core printed circuit board to facilitate heat transfer. Such underfilling, especially when used in conjunction with an LED having an integral heat slug, substantially increases the thermal pathway area, but generally cannot increase the thermal pathway area substantially beyond the overall footprint area of the LED.

In some other approaches, the LEDs are potted using a thermally conductive material. For example, Roney et al., U.S. Pat. No. 5,632,551 and Roney et al., U.S. Pat. No. 5,528,474 disclose potted LED assemblies. Typically, the potting material is a two-component epoxy or other two-component potting material that is combined or mixed as it is applied to the lighting assembly, and is then cured. Polycondensation, addition reactions, or other chemical processes occurring in the mixture during curing causes solidification of the potting material around the LEDs of the lighting assembly.

Potting can provide a larger thermal contact area between the LED and the heat sink, but has certain other disadvantages. A container or housing is typically required to retain the potting material in its liquid form during solidification. The container or housing adds weight and bulk to the lighting assembly, and may be problematic for certain low-profile lighting assemblies. Moreover, the potting material typically does not have enough thermal mass by itself to dissipate heat generated by the LEDs. Accordingly, potting is commonly employed in LED-based lighting assemblies in conjunction with a metal heat sink.

The following contemplates improved apparatuses and methods that overcome the above-mentioned limitations and others.

BRIEF SUMMARY

According to one aspect, a lighting assembly is disclosed, including a printed circuit board and one or more light emitting diode diodes (LEDs) disposed on the printed circuit board and connectable with a power source via circuitry of the printed circuit board. A thermoplastic oveiniolding covers at least portions of the printed circuit board proximate to the one or more LEDs. The thermoplastic of the thermoplastic overmolding has a melting temperature greater than about 100° C. and has a thermal conductivity greater than or about 1 W/m·K.

According to another aspect, a method of manufacturing a lighting assembly is disclosed. One or more light emitting diode diodes (LEDs) are attached to a printed circuit board. The attached LEDs are connectable with a power source via circuitry of the printed circuit board. An overmolding material is insert molded an over at least portions of the printed circuit board proximate to the LEDs. The overmolding material has a melting temperature greater than about 100° C. and has a thermal conductivity greater than or about 1 W/m·K.

According to another aspect, a method of manufacturing a lighting assembly is disclosed. One or more light emitting diode diodes (LEDs) are attached to a printed circuit board. The attached one or more LEDs are connectable with a power source via circuitry of the printed circuit board. A thermoplastic is reflowed over at least portions of the printed circuit board proximate to the one or more LEDs. The thermoplastic has a melting temperature greater than about 100° C. and has a thermal conductivity greater than or about 1 W/m·K.

According to another aspect, a lighting assembly is disclosed, including a printed circuit board and a plurality of light emitting diode diodes (LEDs) disposed on the printed circuit board and connectable with a power source via circuitry of the printed circuit board. A free standing high thermal conductivity material overmolding covers at least portions of the printed circuit board proximate to the LEDs. The free standing high thermal conductivity material has a melting temperature greater than about 100° C. and has a thermal conductivity greater than or about 1 W/m·K.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

FIG. 2A diagrammatically shows the printed circuit board with LEDs attached, arranged between mating components of an insert injection mold. FIG. 2B diagrammatically shows the lighting assembly inside the mating components of the insert mold, but before injection of the melted thermoplastic. FIG. 2C diagrammatically shows the lighting assembly inside the mating components of the insert mold after injection of the melted thermoplastic.

DETAILED DESCRIPTION OF PREFERRED EMBODIMENTS

Figure 1:
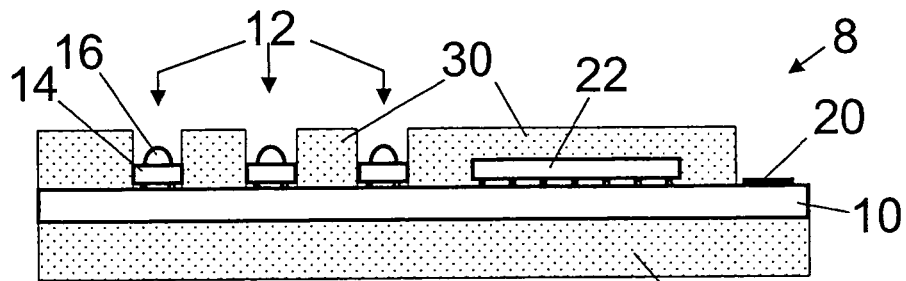
FIG. 1 diagrammatically shows a lighting assembly including LEDs and free-standing high thermal conductivity material overmolding on both front and back principal sides of a supporting printed circuit board.

With reference to FIG. 1, a lighting assembly 8 includes a printed circuit board 10 on which one or more light emitting diodes (LEDs) 12 are attached. In the illustrated embodiment, three LEDs are attached to the printed circuit board, however, the number of attached LEDs can be one, two, three, four, or more. Substantially any type of LED can be attached, such as for example: a white LED including an ultraviolet group III-nitride-based electroluminescent semiconductor diode coated by a white-light emitting phosphor blend; a white LED including a blue or violet group III-nitride-based electroluminescent semiconductor diode coated by a yellowish-light emitting phosphor blend; a blue LED including a blue group III-nitride-based electroluminescent semiconductor diode; a red LED including a red group III-arsenide, group III-phosphide, or group III-arsenide-phosphide electroluminescent semiconductor diode; a red LED including a red group III-arsenide, group III-phosphide, or group III-arsenide-phosphide laser diode; an organic electroluminescent light emitting diode; or so forth. In the illustrated embodiment, each LED 12 includes a base 14 containing an electroluminescent semiconductor chip and an optional heat slug (internal components not shown), and a light emitting aperture including a lens 16. Suitable LEDs include, for example, Luxeon® emitters (available from LumiLeds Lighting, LLC, San Jose, Calif.).

The printed circuit board 10 includes printed circuitry (not shown) connecting the one or more LEDs 12 with a suitable power input such as illustrated electrical pads 20 disposed on the printed circuit board 10, or a power receptacle disposed on or connected with the printed circuit board, or so forth. Optionally, the lighting assembly 8 includes other electrical or electronic components such as an illustrated power conditioning integrated circuit 22, a current-limiting resistor, an electrostatic discharge protection device, or so forth. In the illustrated lighting assembly 8, the LEDs 12 and other components 22 are disposed on a single principal side of the printed circuit board 10; however, in other embodiments components may be disposed on both principal sides of the printed circuit board and electrically interconnected by suitable through-hole vias, wrap-around printed circuitry, or so forth.

The LEDs 12 can be attached to the printed circuit board 10 in any suitable manner, such as soldering to bonding pads of the printed circuitry, insertion into a suitable socket adapted to receive the leads of the LED, or so forth. If the LED includes an integral heat slug, this may be separately soldered or attached to the printed circuit board by a suitable underfill material. In some LED designs, the slug is not electrically neutral, in which case the slug attachment should be electrically isolated from the attachments of the LED leads. Commercial LEDs typically have suitable manufacturer-specified attachment methods or procedures. While surface-mount LEDs are advantageous, it is also contemplated to employ wire-bonded LEDs with suitable wire bond electrical connections. The additional components 22 can be similarly attached by suitable methods, such as insertion into a suitably adapted socket, soldering, wire bonding, or so forth.

The printed circuit board 10 of the lighting assembly 8 shown in FIG. 1 does not include a metal core or other metal heat sink. Rather, a front-side free-standing high thermal conductivity material overmolding 30 and a backside free-standing high thermal conductivity material overmolding 32 are disposed on the front and back principal sides, respectively, of the printed circuit board 10. In some embodiments, the free-standing high thermal conductivity material used for the overmolding 30, 32 is a thermally conductive thermoplastic material or a thermally conductive thermoset material. In some embodiments, the free-standing high thermal conductivity material used for the overmolding 30, 32 is a Therma- Tech™ liquid crystalline polymer, thermally conductive and electrically insulating thermoplastic material (available from PolyOne Corporation, Avon Lake, Ohio). Therma-Tech™ thermally conductive thermoplastic is available with thermal conductivity values of between greater than about 1 W/m·K (e.g., electrically insulating Therma-Tech™ LC5000C TC has thermal conductivity of about 2-3 W/m·K), and greater than about 10 W/m·K (e.g., electrically conductive Therma-Tech™ SF-4500 TC and LC-6000 TC have thermal conductivities of 10.90 W/m·K and 18-20 W/m·K, respectively). If an electrically conducting high thermal conductivity material is used, then any printed circuitry, LED leads, or other exposed conductors are suitably coated with an insulative dielectric before disposing the electrically and thermally conductive high thermal conductivity material. On the other hand, electrically insulating high thermal conductivity material arial such as Therma-Tech™ LC5000C TC can be disposed onto conductors without an intervening insulative layer.

Figure 2A:
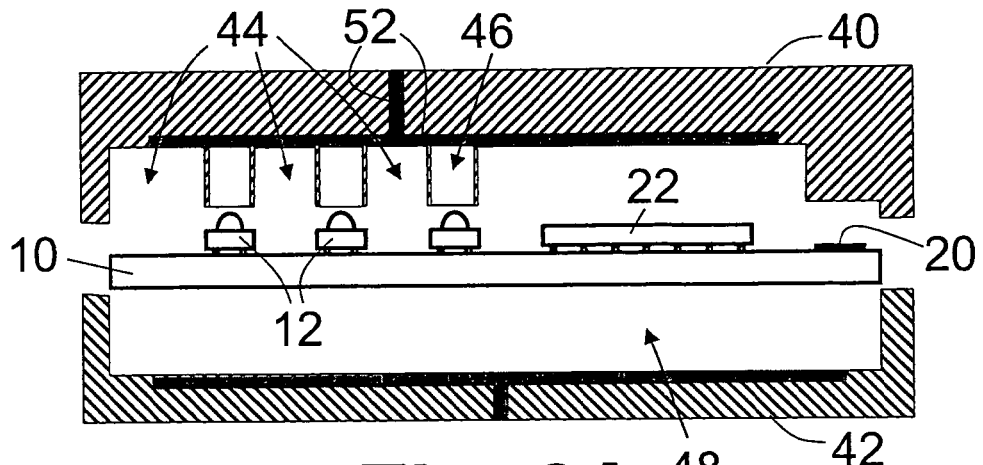
FIGS. 2A, 2B, and 2C diagrammatically show an insert injection molding process for forming the free-standing high thermal conductivity material overmolding of the lighting assembly of FIG. 1.
Figure 2B:
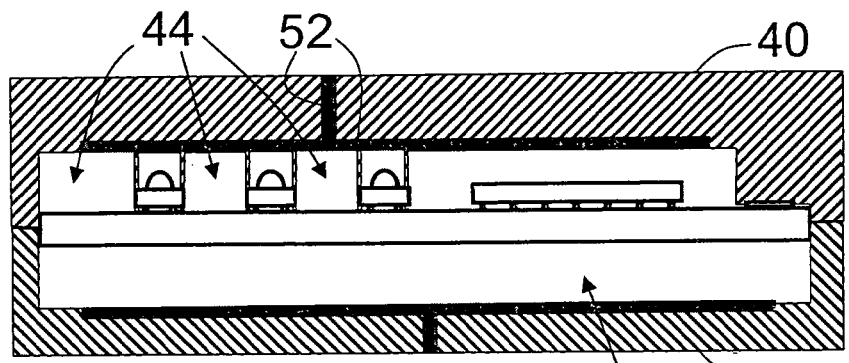
Figure 2C:
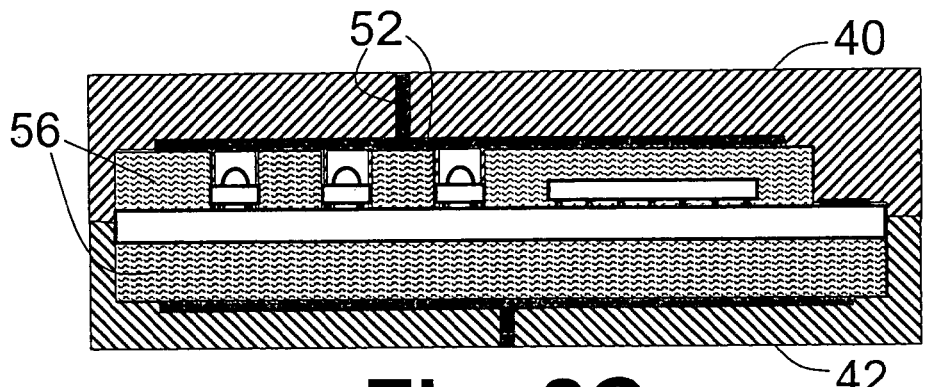

With reference to FIGS. 2A, 2B, and 2C, in some embodiments the free-standing high thermal conductivity material overmolding 30, 32 are formed simultaneously by insert molding. The resulting overmoldings 30, 32 are free-standing after removal from the insert mold. As shown in FIG. 2A, the printed circuit board 10 with LEDs 12 and other components 22 attached is disposed between mating components 40, 42 of an insert mold. FIG. 2B shows the two mating mold components 40, 42 after mating to form the closed insert mold having a cavity containing the printed circuit board 10 with LEDs 12 and other components 22 attached. The mold component 40 is designed with molding regions 44 for forming the front-side overmold 30, and optional isolation regions 46 that receive the LEDs 12 to prevent at least the light output apertures of the LEDs 12 including the lenses 16 from being covered by the overmolding. In some embodiments, the isolation regions define gaps between the LEDs 12 and the frontside overmolding 30. In the illustrated lighting assembly 8, the isolation regions 46 allow the frontside overmolding 30 to approximately abut the bases 14 of the LEDs 12. In some embodiments, the isolation regions allow the frontside overmolding 30 to overcoat a portion of the base 14. If the high thermal conductivity material of the overmolding 30 is sufficiently optically transmissive, it is also contemplated to omit the isolation regions 46 and allow the front-side overmolding 30 to cover the lenses 16 of the LEDs 12. The mating insert mold component 42 includes a molding region 48 for forming the backside overmold 32.

With reference to FIG. 2C, the thermally conductive thermoplastic or other high thermal conductivity molding material is typically supplied in pellets or other solid pieces (not shown) that are heated to form molten molding material that is delivered under pressure to the cavity by delivery conduits 52, such as a sprue and runners delivery system. Injected melted high thermal conductivity molding material 56 tills the molding regions 44, 48 where it solidifies to define the front-side and backside high thermal conductivity material overmoldings 30, 32. The mold 40, 42 is then opened and the lighting assembly 8 is removed. Optionally, flash or other molding artifacts are trimmed off.

The insert molding process described with example reference to FIGS. 2A, 2B, and 2C is an illustrative example. Substantially any insert molding process can be employed to form the high thermal conductivity material overmoldings 30, 32. Because the lighting assembly 8 is removed from the mold 40, 42 after completion of the insert injection molding process, the lighting assembly 8 suitably does not include a container or housing configured to contain the thermoplastic or other high thermal conductivity overmoldings 30, 32. Rather, the high thermal conductivity overmoldings 30, 32 are free standing, enabling the lighting assembly 8 to have a low profile.

Figure 3:
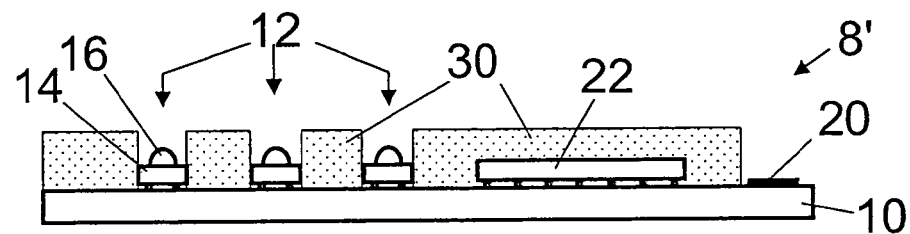
FIG. 3 diagrammatically shows a lighting assembly similar to that of FIG. 2, but including the free-standing high thermal conductivity material overmolding on only one side of the printed circuit board.

With reference to FIG. 3, a lighting assembly 8' is similar to the lighting assembly 8 of FIG. 1, except that the backside free-standing high thermal conductivity material overmolding 32 is omitted. Omission of the backside free-standing high thermal conductivity material overmolding 32 can simplify the insert molding or other overmolding processing, and can make it easier to mount the lighting assembly. However, including the backside free-standing high thermal conductivity material overmolding 32 improves heat transfer to the surrounding ambient.

Figure 4:
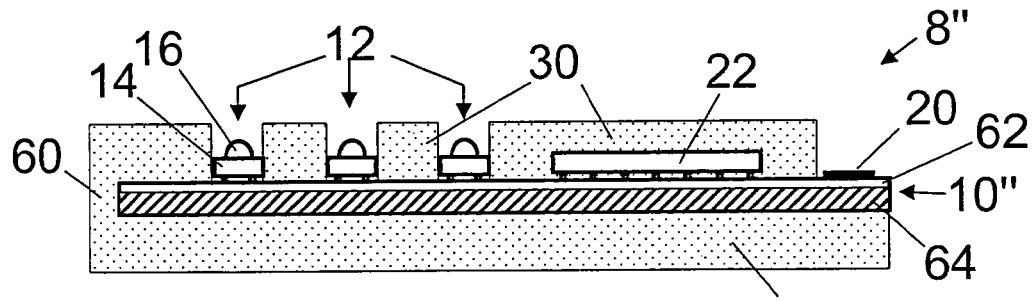
FIG. 4 diagrammatically shows a lighting assembly similar to that of FIG. 2, but in which the printed circuit board is a metal-core printed circuit board.

With reference to FIG. 4, a lighting assembly 8" is similar to the lighting assembly 8 of FIG. 1, except that the printed circuit board 10 is replaced by a metal core printed circuit board 10", and the two high thermal conductivity material overmoldings 30, 32 are connected by an overmolding portion 60 extending across the front and back principal surfaces of the printed circuit board 10" to define a single continuous thermally conductive overmolding 30, 32, 60. The metal core printed circuit board 10" includes a thin dielectric layer 62 disposed on a metal sheet or plate defining the metal core 64. The thin dielectric layer 62 is preferably thin to enable good thermal conduction between the LEDs 12 and other components 22 and the metal core 64. The combination of the thermally conductive overmolding 30, 32, 60 and metal core 64 can provide enhanced heat dissipation versus a lighting assembly with either the overmolding or the metal core alone. However, the metal core 64 is typically made of copper or another high density metal that adds substantial weight to the lighting assembly 8".

Figure 5:
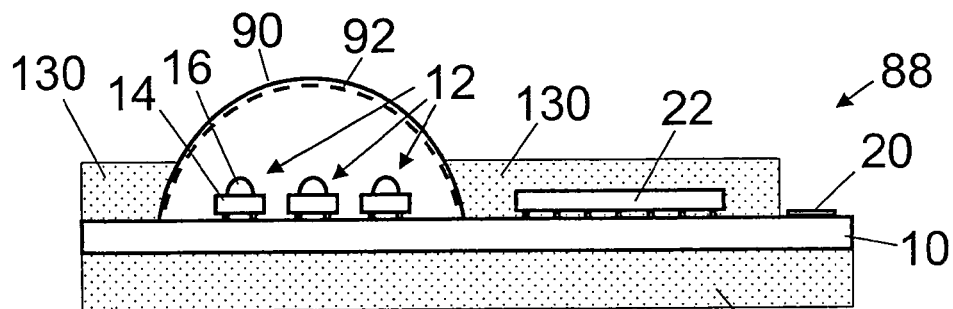
FIG. 5 diagrammatically shows a lighting assembly similar to that of FIG. 2, but in which the light emitting diodes (LEDs) are covered by a dome-shaped light-transmissive cover.

With reference to FIG. 5, a lighting assembly 88 is similar to the lighting assembly 8 of FIG. 1, except that the LEDs 12 are enclosed in a light-transmissive cover such as the illustrated example dome-shaped cover 90 that has its base secured to the printed circuit board 10. Optionally, the light-transmissive cover 90 includes one or more optical coatings 92 (diagrammatically indicated by a dashed line in FIG. 5), such as a phosphor coating, an ultraviolet reflector, or so forth. Some suitable light transmissive cover configurations that enhance light output, provide efficient ultraviolet-to-visible phosphor conversion, protect the LEDs from damaging physical contact, or provide other advantages are disclosed in Aanegola et al., U.S. Publ. Appl. 2005/0239227 A1. A modified front-side free-standing high thermal conductivity material overmolding 130 does not fully cover the light-transmissive cover 90, but rather contacts only the base region near where the light-transmissive cover 90 is secured to the printed circuit board 10.

Figure 6:
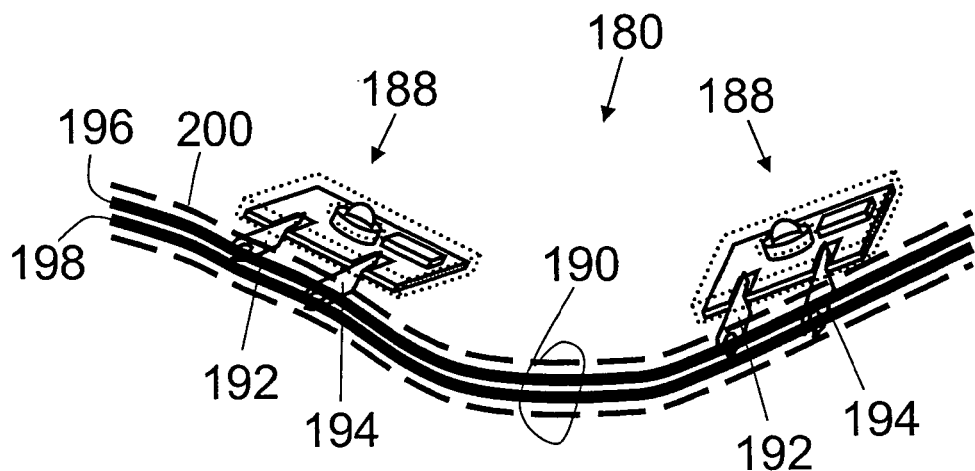
FIG. 6 diagrammatically shows a portion of an LED-based lighting string including spaced-apart lighting assembly modules attached to a flexible electrical cable by insulation-displacing connectors.
Figure 7:
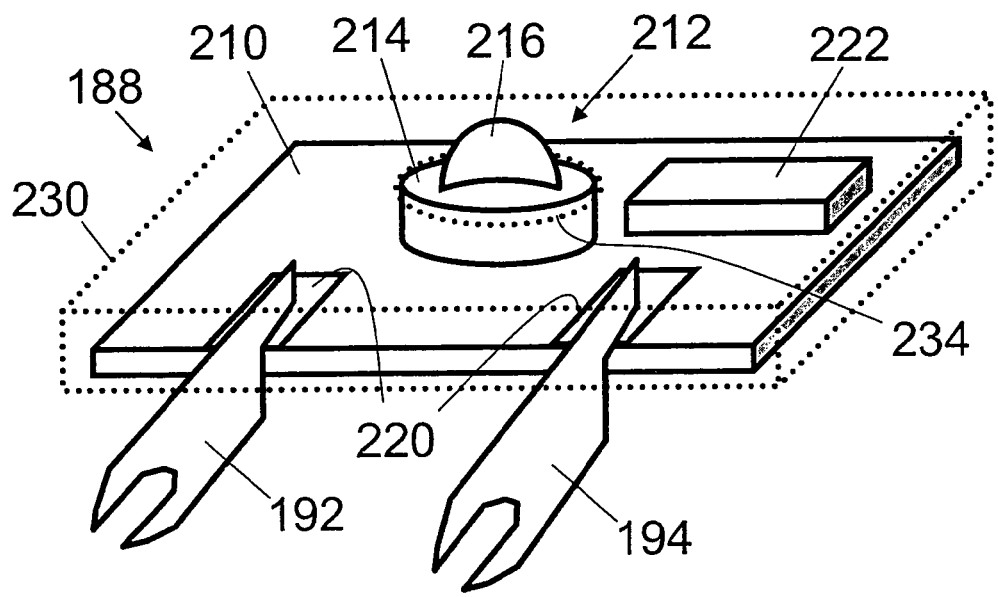
FIG. 7 diagrammatically shows a perspective view of one of the lighting assembly modules of the LED-based lighting string of FIG. 6. The lighting assembly module includes free-standing high thermal conductivity material overmolding, and insulation-displacing connectors for connecting with the flexible electrical cable.

With reference to FIGS. 6 and 7, the disclosed heat management concepts are readily applied to LED-based lighting strings. FIG. 7 illustrates a portion of an example lighting string 180 that includes a plurality of lighting assembly modules 188 connected to an insulated flexible electrical cable 190 by insulation displacing connectors 192, 194. The flexible electrical cable 190 includes a plurality of flexible conductors 196, 198 and insulation 200 (indicated diagrammatically in FIG. 6 by dashed lines) surrounding the flexible conductors 196, 198. The insulation displacing connectors 192, 194 displace the cable insulation 200 and electrically connect with the flexible conductors 196, 198. In other contemplated embodiments, the flexible electrical cable 190 is replaced by a cable having three or more conductors including one or more series conductors for enabling series-parallel interconnection of lighting assembly modules. In other contemplated embodiments, the continuous cable 190 is replaced by short flexible conductor lengths disposed between and electrically connecting neighboring lighting assembly modules.

With particular reference to FIG. 7, each lighting assembly module 188 includes a printed circuit board 210 supporting an LED 212 including a base 214 containing an electroluminescent semiconductor chip and an optional heat slug (internal components not shown), and a light emitting aperture including a lens 216. Suitable LEDs include, for example, Luxeon® emitters (available from LumiLeds Lighting, LLC, San Jose, Calif.). The insulation displacing connectors 192, 194 are soldered or otherwise electrically connected with electrical pads 220 to deliver electrical power from the flexible conductors 196, 198 of the cable 190 to the printed circuit board 210 and thence to the LED 212 via printed circuitry of the printed circuit board 210. Optionally, each lighting assembly module 188 includes other electrical or electronic components such as an illustrated power conditioning integrated circuit 222, a current-limiting resistor, an electrostatic discharge protection device, or so forth. In the illustrated lighting assembly module 188, the LEDs 212 and other components 222 are disposed on a single principal side of the printed circuit board 210; however, in other embodiments components may be disposed on both principal sides of the printed circuit board and electrically interconnected by suitable through-hole vias, wrap-around printed circuitry, or so forth.

A free-standing thermoplastic or other high thermal conductivity material overmolding 230 (indicated diagrammatically by dotted lines in FIGS. 6 and 7) is disposed over the entire printed circuit board 210 and components 212, 222 disposed thereon, except that an opening 234 is provided through which the light output aperture lens 216 and a portion of the base 214 of the LED 212 protrudes. The illustrated free-standing thermoplastic or other high thermal conductivity material overmolding 230 also extends beyond the edges of the printed circuit board 210 to connect the overmoldings on the front and back principal sides of the printed circuit board 210 to define a continuous overmolding. The illustrated free-standing thermoplastic or other high thermal conductivity material overmolding 230 also covers ends of the insulation-displacing connectors 192, 194 in the vicinity of the electrical pads 220 of the printed circuit board. Thus, the free-standing thermoplastic or other high thermal conductivity material overmolding 230 provides thermal dissipation for heat generated at the junction between the insulation-displacing connectors 192, 194 and the electrical pads 220.

Figure 8:
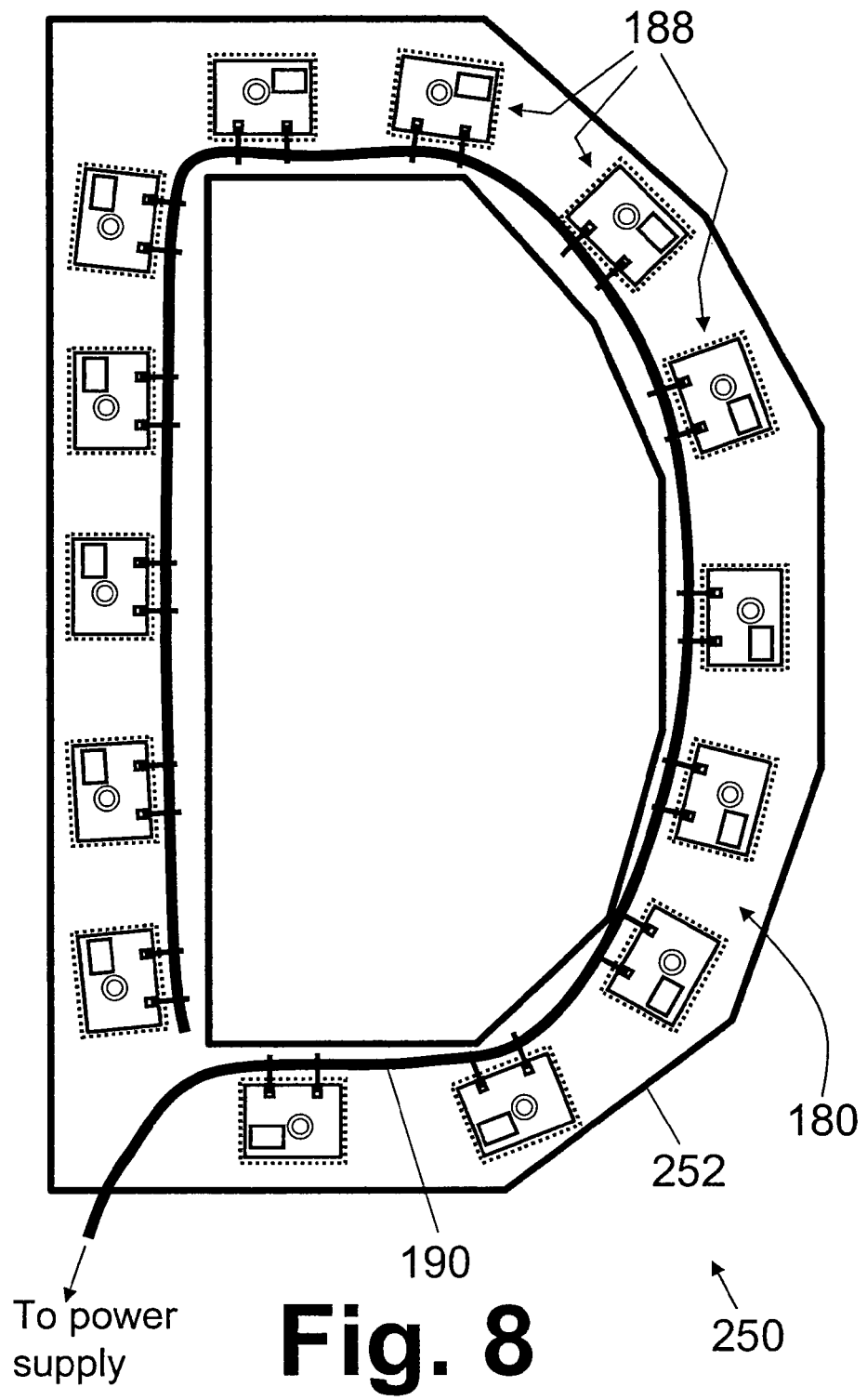
FIG. 8 diagrammatically shows an overhead view of an illuminated channel letter that is illuminated by the lighting string of FIG. 6 disposed inside of the channel letter housing.

With reference to FIG. 8, an example application of the LED-based lighting string of FIG. 6 is shown. An illuminated channel letter 250 includes the lighting string 180 disposed inside of a channel letter housing 252. The example illustrated channel letter housing 252 represents the capital letter "D"; however, channel letter housings representing other capital letters, or lower case letters, or numerals, or other symbols, or images, logos, or so forth, can also be used. In the illustrated embodiment, the lighting string 180 is disposed on a bottom inside surface of the channel letter housing 252, and is suitably secured by cable clamps, adhesive, or so forth (securing not shown in FIG. 8). In other embodiments, the lighting string may be disposed on an inner sidewall of the channel letter. Typically, the channel letter housing 252 includes a light transmissive top cover (not visible in the overhead view of FIG. 8 due to its transparency). The light transmissive top cover may be colored or clear, and is optionally translucent or partially reflective to provide some light scattering.

In each of the lighting assemblies 8, 8', 8", 88 and lighting assembly modules 188, the free-standing thermoplastic or other high thermal conductivity material overmolding 30, 32, 60, 130, 230 provides a lightweight and efficient thermal dissipation pathway for transferring heat produced by the LEDs 12, 212 and optional other components 22, 222 to the external ambient and/or to a thermally conductive mounting surface on which the lighting assembly is disposed. Because the LEDs 12, 212 are preferably high-brightness LEDs that typically operate at temperatures close to 100° C., the free-standing thermoplastic or other high thermal conductivity material overmolding 30, 32, 60, 130, 230 should have a melting temperature greater than about 100° C. to ensure that the thermoplastic does not melt during operation of the lighting assembly. If the high thermal conductivity material of the overmolding 30, 32, 60, 130, 230 is a thermoset material, then the thermoset material should be thermally stable at up to about 100° C. after the thermosetting process is completed.

At the same time, the LEDs 12, 212 and optional other components 22, 222, or features associated therewith such as phosphor coatings, solder, thermosonic, or other bonds, or so forth, are typically temperature-sensitive. Since the overmolding is typically performed after attachment of these temperature-sensitive components, the overmolding process should not expose these components to excessive temperature. If insert injection molding is used to apply the overmolding 30, 32, 60, 130, 230, then the melted overmolding material in the insert mold should be at a temperature of greater than about 100° C. (in order to be melted, that is, in a liquid or other low viscosity phase) and at a temperature less than a damage temperature threshold for elements of the lighting assembly. The damage temperature threshold is determined by the lowest temperature that will damage a heat-sensitive element of lighting assembly. Depending upon the temperature-limiting element, this upper temperature bound is typically a few hundred degrees Celsius to about 500° C. or higher in some embodiments.

Thermally conductive thermoplastics, such as the example Therma-Tech™ thermoplastic which melts at between 310° C. and 350° C., are advantageous for use as the high thermal conductivity material of the overmolding 30, 32, 60, 130, 230 because these melting temperatures are high enough to avoid reflow of the thermoplastic at LED operating temperatures, but low enough to enable injection molding or other formation of the high thermal conductivity overmolding 30, 32, 60, 130, 230 without damaging temperature-sensitive elements of the lighting assembly. Because thermoplastics do not require heating to induce a thermosetting chemical reaction, thermoplastics are melted to perform insert injection molding without a concomitant chemical reaction, and so the melting temperature of thermoplastics is typically relatively low.

In contrast, thermosetting materials tend to be brought to a higher temperature in the insert mold so as to thermally drive polymeric cross-linking or other thermosetting chemical reactions. However, a thermally conductive thermoset material can also be used for the high thermal conductivity material overmolding 30, 32, 60, 130, 230 if the thermosetting temperature is below the damage temperature threshold for the lighting assembly.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of manufacturing a lighting assembly, the method comprising:
   locating one or more light emitting diodes (LEDs) on a printed circuit board;
   electrically and mechanically connecting the printed circuit board to a plurality of flexible electrical conductors;
   disposing one or more light-transmissive covers over said one or more LEDs;
   placing the circuit board with attached LEDs and flexible electrical conductors in a mold, said mold including one or more isolation regions associated with the one or more LEDs and one or more light-transmissive covers; and
   insert molding an overmolding material over at least portions of the printed circuit board proximate the LEDs;
   wherein the one or more isolation regions prevent an at least one aperture and a portion of the light-transmissive cover over the LEDs from being covered with overmolding material.

2. The method of manufacturing a lighting assembly as set forth in claim 1, wherein the one or more light-transmissive covers each encloses more than one LED.

3. The method of manufacturing a lighting assembly as set forth in claim 1, wherein the one or more light-transmissive covers each encloses one LED.

4. The method of manufacturing a lighting assembly as set forth in claim 1, wherein the electrically connecting step comprises insulation displacement connectors displacing the conductor insulation and electrically connecting the flexible electrical conductors to the printed circuit board.

5. The method of manufacturing a lighting assembly as set forth in claim 1, wherein the one or more light-transmissive covers include a base region disposed on the printed circuit board and wherein the overmolding contacts the base region without fully covering the one or more light-transmissive covers.

6. The method of manufacturing a lighting assembly as set forth in claim 1, wherein the overmolding material has a melting temperature preferably between about 100° C. and about 500° C.

7. The method of manufacturing a lighting assembly as set forth in claim 6, wherein the overmolding material has a melting temperature more preferably between about 310° C. and about 350° C.

8. A method of manufacturing a lighting assembly wherein the method as set forth in claim 1 is repeated a plurality of times to produce a plurality of light assemblies interconnected to create LED-based lighting strings.

9. The method of manufacturing a lighting assembly as set forth in claim 1, wherein the overmolding material has a thermal conductivity greater than 1 W/m·K.

* * * * *